United States Patent [19]

Shimakura et al.

[11] Patent Number: 5,173,127
[45] Date of Patent: Dec. 22, 1992

[54] SEMI-INSULATING INP SINGLE CRYSTALS, SEMICONDUCTOR DEVICES HAVING SUBSTRATES OF THE CRYSTALS AND PROCESSES FOR PRODUCING THE SAME

[75] Inventors: Haruhito Shimakura; Osamu Oda; Keiji Kainosho, all of Toda, Japan

[73] Assignee: Nippon Mining Co., Ltd., Tokyo, Japan

[21] Appl. No.: 661,616

[22] Filed: Feb. 28, 1991

[30] Foreign Application Priority Data

Mar. 2, 1990 [JP] Japan .................. 2-51370
May 1, 1990 [JP] Japan .................. 2-115403
May 11, 1990 [JP] Japan .................. 2-122669

[51] Int. Cl.$^5$ ........................... H01L 29/12
[52] U.S. Cl. ..................... 148/33.6; 437/42; 257/387; 257/368
[58] Field of Search ............ 148/33.6; 437/24

[56] References Cited

U.S. PATENT DOCUMENTS 4,004,953 1/1977 Otsubo et al. ............ 437/119
4,268,844 5/1981 Meiners .................... 357/58

FOREIGN PATENT DOCUMENTS 2544286 4/1976 European Pat. Off. .
0196854 8/1988 European Pat. Off. .
63-220632 7/1988 Japan .

OTHER PUBLICATIONS

Applied Physics, vol. A48, 1989, pp. 315–319, New York, US; D. Hofmann et al. "Semi–insulating Electrical Properties of Undoped InP after Heat Treatment in a Phosphorus Atmosphere".

Primary Examiner—Olik Chaudhuri
Assistant Examiner—Long Pham
Attorney, Agent, or Firm—Birch, Stewart, Kolasch & Birch

[57] ABSTRACT

A semi-insulating InP single crystal, semiconductor device with a substrate of crystal and processes of producing the same are disclosed. The crystal is derived from an undoped InP single crystal intermediate. The intermediate has a concentration of all native Fe, Co and Cr of 0.05 ppmw or less. The crystal has a resistivity of $1 \times 10^6$ Ω·cm or more and a mobility of above 3,000 cm$^2$/V·s both at 300 K. A process of producing the crystal includes a step of heat-treating the intermediate under 6 kg/cm$^2$ of phosphorus vapor pressure. The produced semiconductor device is a MIS device operating in essentially the same high-speed manner as a HEMT.

8 Claims, 6 Drawing Sheets

PHOSPHOROUS VAPOR PRESSURE (Kg/cm²)

PHOSPHOROUS VAPOR PRESSURE (Kg/cm²)

CARRIER CONCENTRATION OF RAW InP POLYCRYSTAL (cm$^{-3}$)

CARRIER CONCENTRATION OF RAW InP POLYCRYSTAL (cm$^{-3}$)

SEMI-INSULATING INP SINGLE CRYSTALS, SEMICONDUCTOR DEVICES HAVING SUBSTRATES OF THE CRYSTALS AND PROCESSES FOR PRODUCING THE SAME

BACKGROUND OF THE INVENTION

1. Field of the Invention

The present invention relates to a semi-insulating InP single crystals used in electronic devices, in particular, OEICs (i.e., optolectronic IC), HEMTs (i.e., high electron mobility transistor) and ion implanted FETs (i.e., field effect transistor), to a process of producing the InP single crystals, to a semiconductor device and a process of producing the semiconductor device, and more particularly to a MISFET (i.e., metal insulator semiconductor FET) and a process of producing the MISFET.

2. Description of the Related Art

For semi-insulating compound semiconductor crystals including Si or S as n-type impurities, a process of adding Fe, Co or Cr as deep acceptors to the crystal has been industrially used. The principle of semi-insulation is based on a mechanism in which deep acceptors compensate shallow donors. Thus, it has been believed that the added amount of an element which acts as an acceptor must be larger than the content of donors in the compound semiconductor crystal in order to semi-insulate the crystal.

However, the amount of Fe, Co or Cr doping the compound semiconductor crystals for the semi-insulation is preferred to be as small as possible. This is because Fe, Co and Cr serve as deep acceptors in ion implanted electronic devices and substrates made of these Fe, Co or Cr doped compound semiconductor crystals, e.g., an FET, and they reduce the activation efficiency of implanted ions therein. In the case of devices operating at high frequencies such as an OEIC or HEMT, Fe, Co and Cr diffuse in the epitaxial layers, trap carriers and deteriorate high-frequency and high-speed performances.

In addition, Fe, Co and Cr easily segregate so that the concentrations thereof differ in upper and lower portions of the compound semiconductor crystals, resulting in the nonuniformity of activation efficiency over the crystal, and therefore resulting in low yields of compound semiconductor crystals doped with Fe, Co or Cr.

Heretofore, Fe doped InP single crystals have been generally used for semi-insulating InP single crystal substrates for electronic devices. When the concentration of Fe in InP single crystal is less than 0.2 ppmw, the resistivity is reduced to below $10^6 \Omega \cdot cm$ and the semi-insulation is deteriorated. Thus, Fe had to be doped with more than 0.2 ppmw in order to retain the semi-insulation thereof.

Generally, it has been believed that a reduced concentration of all of Fe, Co and Cr in the compound semiconductor single crystal reduces the resistivity of the compound semiconductor single crystal since the concentration of a native impurity (i.e., residual impurity) providing a donor amounts to a level of reduced concentration of all of the Fe, Co and Cr.

However, the present inventors proposed that the electrically active point defect, as well as the compensation by donors and deep acceptors characterize the mechanism of semi-insulating the InP single crystal and diligently studied to discover that controlling the density of the point defect by means of heat-treating the InP single crystal caused even a much lower concentration of the deep acceptors than a prior art concentration thereof so as to semi-insulate the InP single crystal or compound semiconductor single crystal.

Thus, the inventors previously provided a process of producing a compound semiconductor having a concentration of 0.2 ppmw or less for all of Fe, Co and Cr and a resistivity of $1 \times 10^7 \Omega \cdot cm$ or more (see Japanese patent application SHO.63-220632). The techique of the Japanese patent application SHO.63-220632 is a process which includes the steps of vacuum sealing in a quartz ampoule a compound semiconductor crystal wafer including a concentration of 0.2 ppmw or less of Fe, Co or Cr, placing in the quartz ampoule an element of the compound semiconductor crystal wafer or a compound semiconductor crystal including the element, and heating the quartz ampoule at 400°–640° C. so that the pressure in the quartz ampoule is equal to or higher than a dissociation pressure of the element of the compound semiconductor crystal wafer.

Hofmann et al discloses in "Appl. Phys. A 48, pages 315–319 (1989)" that heat-treating an undoped InP single crystal wafer with a $3.5 \times 10^{15}$ cm$^{-3}$ concentration of a carrier at a phosphorous vapor pressure of about 5 kg/cm$^2$ (i.e., 5 bar) at 900° C. for 80 hr, produced an InP wafer having a resistivity of $2 \times 10^7 \Omega \cdot cm$. This is supposed because the electrically active point defect is concerned in the same manner as in the process of the Japanese patent application SHO. 63-220632.

The present inventors further studied from the process of the Japanese patent application SHO. 63-220632 to discover that even heat-treating an undoped InP single crystal including a concentration of 0.05 ppmw or less for all of Fe, Co and Cr failed to semi-insulate the crystal.

In addition, in the process of Hofmann et al, heat-treating an undoped InP single crystal having a $3.5 \times 10^{15}$ cm$^{-3}$ carrier concentration deteriorated the mobility from 450 cm$^2$/V·s or more to 300 cm$^2$/V·s or less although the resistivity thereof occasionally was $1 \times 10^6 \Omega \cdot cm$ or more. A significantly high carrier concentration of the undoped InP single crystal provided a resistivity of $10-1 \times 10^5 \Omega \cdot cm$ and seldom achieved a resistivity of $1 \times 10^7 \Omega \cdot cm$ or more. Thus, the present inventors generally reviewed the results of the studies described above and concluded that unless the phosphorous vapor pressure to heat treatment temperature ratio was a limitation, no semi-insulating InP single crystal with a sufficient mobility could be obtained.

SUMMARY OF THE INVENTION

The present invention was made on the basis of the above discoveries.

A first aspect of the present invention is to provide an undoped semi-insulating InP single crystal having a resistivity of $10^6 \Omega \cdot cm$ or more at 300 K and a mobility of above 3,000 cm$^2$/V·s, the crystal having a concentration of 0.05 ppmw or less (i.e., the resolution of an analyzer) of all the native Fe, Co and Cr.

A second aspect of the present invention is to provide a process of producing the semi-insulating InP single crystal of the first aspect of the present invention, including the steps of placing and vacuum sealing both an undoped InP single crystal intermediate including a concentration of 0.05 ppmw or less of all the native Fe, Co and Cr (i.e., a retained impurity) and a predetermined amount of phosphorus in a quartz ampoule; and heating the quartz ampoule so that the absolute phosphorous vapor pressure in the quartz ampoule exceeds 6 kg/cm². The InP single crystal intermediate is preferably derived from an InP polycrystal having a carrier concentration of $3 \times 10^{15}$ cm$^{-3}$ or less.

A third aspect of the present invention is to provide a MISFET including a substrate made of a semi-insulating InP single crystal of the first aspect of the present invention, an insulating layer formed on the top surface of the substrate, a gate electrode formed on the insulating layer and a source electrode and a drain electrode both formed on the top surface of the substrate, the source and drain electrodes being formed on opposite sides of the gate electrode.

A fourth aspect of the present invention is to provide a process of producing a MISFET of the third aspect of the present invention. In the step of producing the insulating layer, the substrate made of the an undoped InP single crystal of the first aspect of the present invention is placed in a vacuum ampoule, a predetermined amount of phosphorus and a predetermined amount of oxygen gas are added and then the vacuum ampoule is heated, preferably to oxidize the surface of the substrate under a phosphorous vapor pressure to produce the insulating layer.

In accordance with HEMT, a kind of very high-speed electronic device, an InAlAs layer of a high bandgap causes a band bend in an active layer comprising an undoped InGaAs layer to produce a channel of high carrier concentration in the active layer.

On the other hand, the MISFET of the third aspect of the present invention includes a high bandgap layer comprising an insulating layer, e.g., a thermally oxidized layer, of $SiN_x$ or $SiO_2$, of a high bandgap instead of the InAlAs layer of a HEMT, and an InP single crystal substrate having an electron mobility of above 3,000 cm²/V·s instead of the active layer of a HEMT. As shown in FIG. 7, an application of a positive voltage to the gate formed on the insulating layer of the MISFET thus causes a band bend in the interface between the insulating layer and substrate to produce a channel of high electron density. Since the InP single crystal of the substrate is of high purity and has a high mobility, the MISFET has a two-dimensional electron layer of a high electron mobility to provide essentially the same high-speed electronic device as a HEMT. Since the interior of the substrate has a semi-insulation of a resistivity of $1 \times 10^6 \Omega \cdot cm$, an isolation of devices formed in the substrate is facilitated, which is favorable for production of an IC. When thermally oxidizing the surface of the InP single crystal substrate under the phosphorous vapor pressure produces the insulating layer, the insulating layer takes in an impurity present on the top surface of the substrate to reduce the interface trap level density of the substrate, resulting in a higher-speed electronic device.

The InP single crystal of the first aspect of the present invention has high resistivity and high mobility although the concentration of all of Fe, Co and Cr is 0.05 ppmw or less. Therefore, it is appropriate for a semi-insulating compound semiconductor substrate for electronic devices. In particular, when it is used for OEIC and HEMT substrates, the Fe concentration thereof is so low that Fe cannot diffuse in an epitaxial layer. This provides an OEIC and HEMT having good high-frequency and high-speed performances. On the other hand, when it is used for an ion implanted FET, the Fe is low so that the activation ratio of implanted ions is increased. In addition, amounts of Fe segregating in upper and lower areas of the InP single crystal are negligible so that the activation ratio of the implanted ions are uniform over the InP single crystal, thus increasing yields of the OEIC and HEMT devices.

DESCRIPTION OF THE PREFERRED EMBODIMENTS

EXAMPLE 1

An undoped InP single crystal ingot of a concentration of 0.05 ppmw (i.e., the resolution of an analyzer) or less for all of Fe, Co and Cr was grown from a raw InP polycrystal of a $(1-3) \times 10^{15}$ cm$^{-3}$ carrier concentration by the Liquid encapsulated Czochralski method.

A 0.5 mm thick as-cut undoped InP single crystal wafer was sliced from the InP single crystal ingot. The InP single crystal wafer and a red phosphorus were placed in a quartz ampoule. A gas in the ampoule was evacuated so that the pressure therein was $1 \times 10^{-6}$ torr. Then, an oxyhydrogen burner melted the open end of the quartz ampoule to seal the quartz ampoule. The amount of the red phosphorous was adjusted so that the phosphorous vapor absolute pressure in the quartz ampoule was 15 kg/cm² at 900° C., i.e., a heat treatment temperature. Then, the quartz ampoule was placed in a closed type horizontal heating furnace, heated and held at 900° C. for 20 hr and then naturally cooled. The used horizontal heating furnace can allow a pressure of up to 100 kg/cm² (gauge pressure). During temperature-increasing and cooling, the heating furnace received an argon gas of a pressure corresponding to a phosphorous vapor pressure at an increasing or cooling temperature in order to maintain a pressure balance inside and outside the quartz ampoule and avoid a breakdown in the quartz ampoule.

EXAMPLE 2

The amount of red phosphorus was adjusted so that the phosphorous vapor absolute pressure in the quartz ampoule was 7.5 kg/cm² at 900° C. Other conditions equalled those of Example 1.

A 50 μm thickness of the surface of InP wafers of Examples 1 and 2 was lapped. Then, the resistivity and mobility of the InP wafer were measured at 300K by Van der Pauw method.

Table 1 shows the result of the measurement:

TABLE 1

| | Phosphorous vapor absolute pressure in heat treatment (kg/cm²) | Resistivity (Ω · cm) | Mobility (cm²/V · s) |
|---|---|---|---|
| Before heat treatment | — | $3.9 \times 10^{-1}$ | 4,500 |
| Example 1 | 15 | $1.5 \times 10^7$ | 4,400 |
| Example 2 | 7.5 | $8.9 \times 10^6$ | 4,500 |
| Control | 5 | $2 \times 10^7$ | 1,400 |

Table 1 contains the resistivity and mobility of the control of an undoped InP single crystal which was heat treated at 900° C. under a 5 kg/cm² phosphorous vapor absolute pressure for 80 hr.

Figure 1:
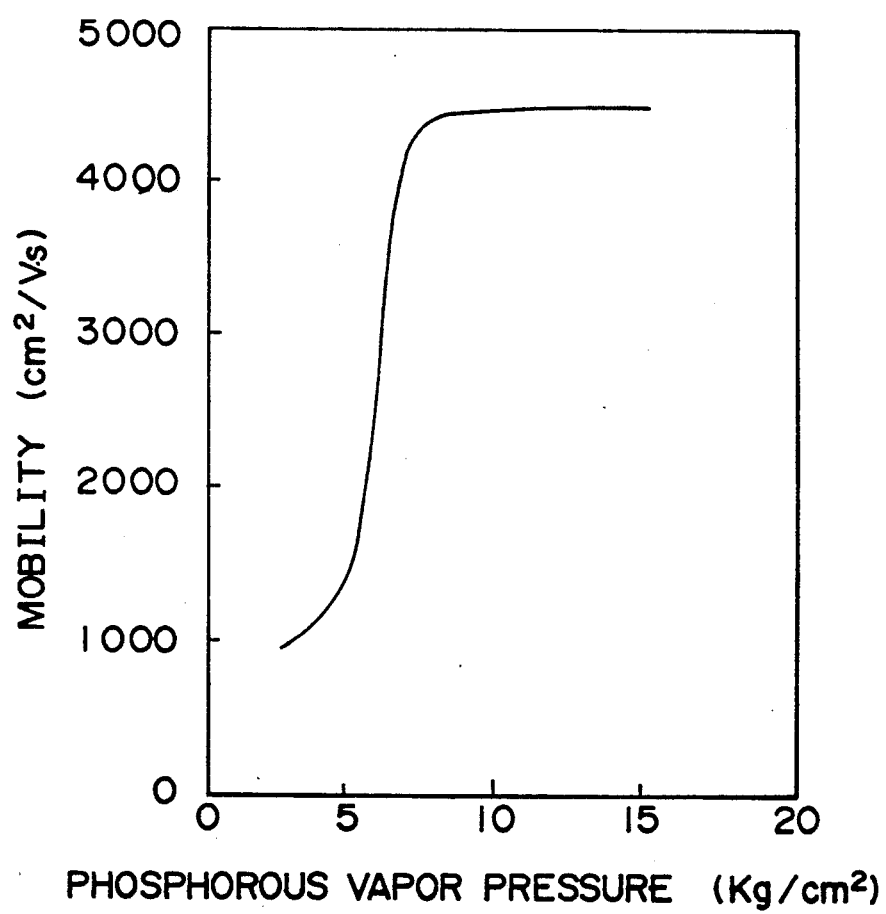
FIG. 1 is a graph of a relationship between the phosphorous vapor pressure in heat-treating an undoped InP single crystal and the mobility of a final InP single crystal.

FIG. 1 is a graph of the measured mobility values.

As seen in FIG. 1, heat-treating the undoped InP single crystal wafer so that the phosphorous vapor pressure in the heat treatment was above an absolute 6 kg/cm² produced a semi-insulative InP single crystal of a resistivity of $1 \times 10^6$ or more and an above 3,000 cm²/V·s mobility both at 300 K.

In order to test whether or not the resistivity and mobility of an electronic device with a substrate of the semi-insulating InP single crystal of the high mobility obtained in Examples 1 and 2 were maintained, a 150 nm thick SiN$_x$ layer was deposited on the surface of each of the InP wafers, then the InP wafers were cap annealed at 700° C. for 15 min and the resistivities and mobilities of the InP wafers were measured.

Figure 2:
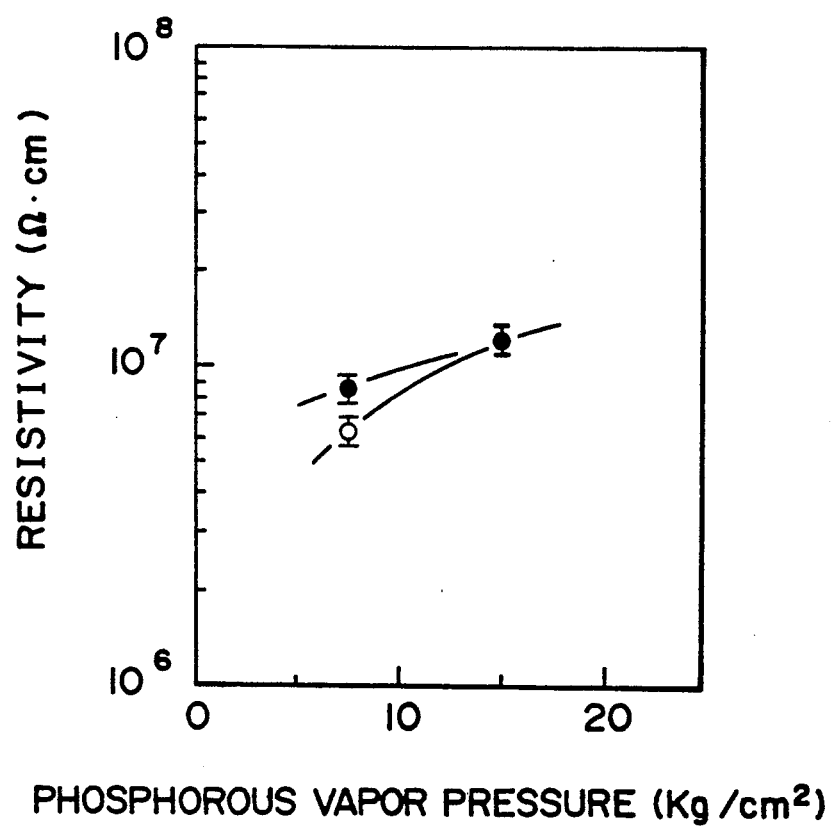
FIG. 2 is a graph of the relationship between the resistivity of the final InP single crystal wafer and the phosphorous vapor pressure in heat-treating an undoped InP single crystal when an InP single crystal wafer which has been subject to the FIG. 1 heat-treatment is cap annealed.
Figure 3:
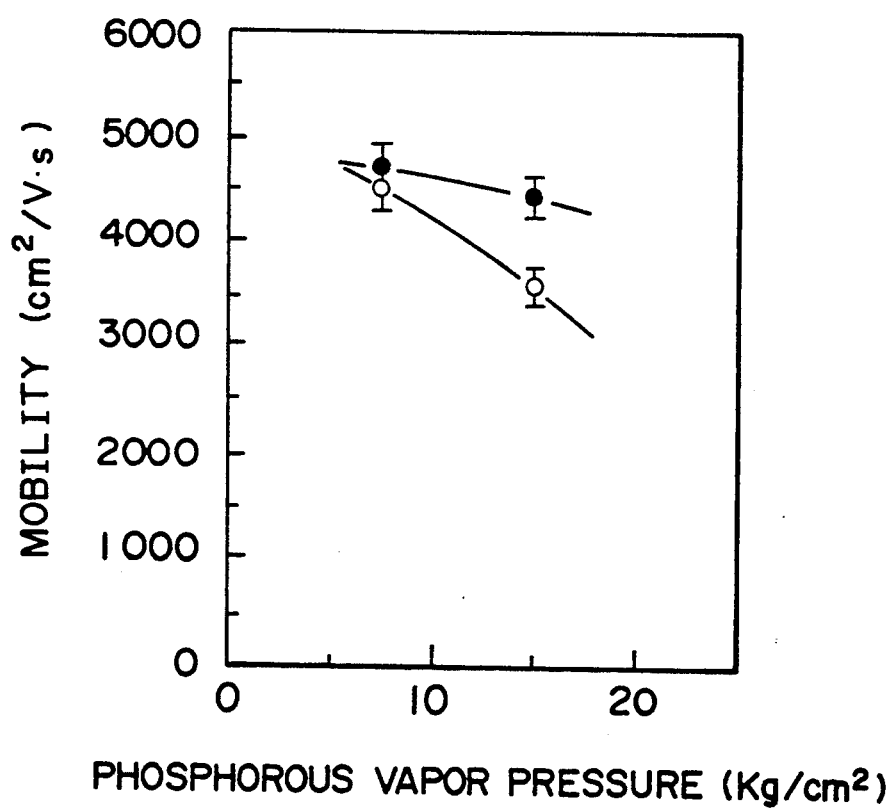
FIG. 3 is a graph of the relationship between the mobility of the final InP single crystal wafer and the phosphorous vapor pressure in heat-treating an undoped InP single crystal when the InP single crystal wafer which has been subject to the FIG. 1 heat-treatment is cap annealed.

FIGS. 2 and 3 represent the result of this measurement. In FIGS. 2 and 3, the symbol of a black circle indicates values before the cap anneal and the symbol of a white circle indicates values after the cap anneal. FIG. 2 indicates that the resistivity of the InP wafer was constant irrespective of the phosphorous vapor absolute pressure. FIG. 3 indicates that the mobility of the InP wafer was slightly reduced but maintained at 3,200 cm²/V·s or more so as to sufficiently be within a practical range.

EXAMPLE 3

An undoped InP single crystal ingot with a concentration of 0.05 ppmw or less for all of Fe, Co and Cr was grown from a raw InP polycrystal having a $1 \times 10^{15}$ cm$^{-3}$ carrier concentration by the Liquid encapsulated Czochralski method.

A 0.5 mm thick as-cut undoped InP wafer which had been sliced from the InP ingot was heat treated in essentially the same manner as in Example 1. That is, this InP wafer and red phosphorus were placed in a quartz ampoule. A gas in the ampoule was evacuated so that the pressure therein was $1 \times 10^{-6}$ torr. Then, an oxyhydrogen burner melted the open end of the quartz ampoule to seal the quartz ampoule. Amounts of the red phosphorus were adjusted so that the phosphorous vapor absolute pressures in the quartz ampoules were 3.0 kg/cm², 7.5 kg/cm² and 15.0 kg/cm² at 900° C. Then, the quartz ampoules were placed in a horizontal heating furnace, heated and held at a 900° C. for 20 hr and then naturally cooled.

Annealed wafers were removed from the ampoule and 50 μm thickness lapped and etched. Then, the resistivity and mobility of the InP wafer were measured at 300 K by the Van Der Pauw method.

Figure 4:
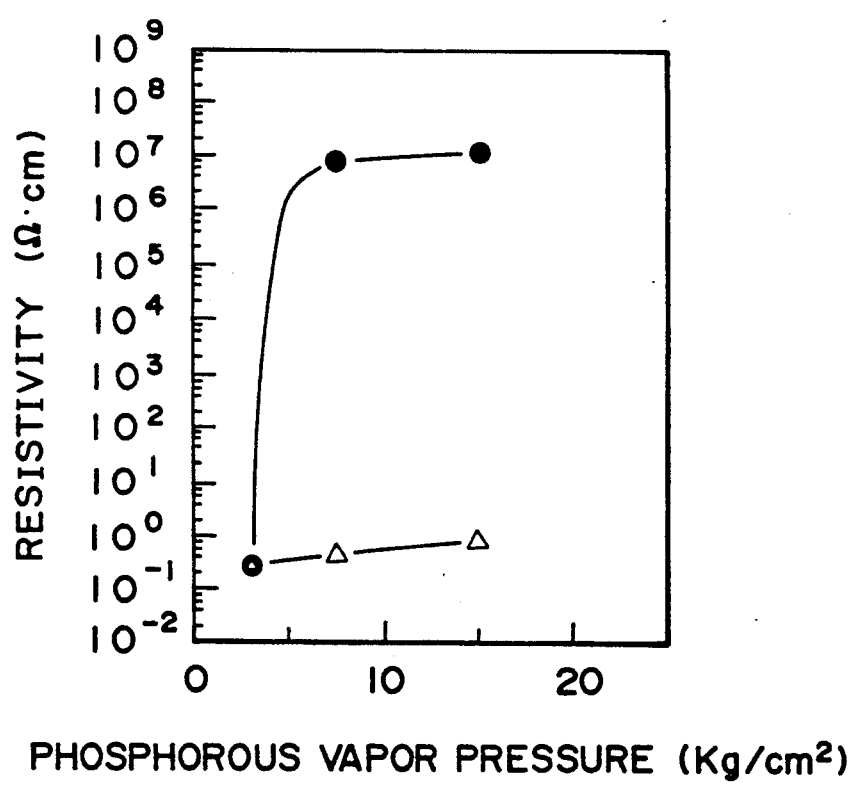
FIG. 4 is a graph of the relationship between a phosphorous vapor pressure in heat-treating an InP single crystal produced from raw InP polycrystals of two different carrier concentrations and the resistivity of the final InP single crystal wafer.

FIG. 4 shows the result of the measurement. In FIG. 4, the symbol of a black circle indicates the resistivity of the InP wafer of Example 3 and the symbol of a white triangle indicates the resistivity of an undoped InP single crystal wafer, the control, grown from an InP polycrystal having a $5 \times 10^{15}$ cm$^{-3}$ carrier concentration by the liquid encapsulated Czochralski method and heat-treated in the same manner as in Example 3.

As seen in FIG. 4, heat-treating the InP single crystal wafer produced from the raw InP polycrystal of the $5 \times 10^{15}$ cm$^{-3}$ carrier concentration under the absolute phosphorous vapor pressure of 7.5 kg/cm² failed to provide an InP single crystal wafer of a high resistivity and on the other hand, heat-treating the InP single crystal wafer produced from the raw InP polycrystal having the $5 \times 10^{14}$ cm$^{-3}$ carrier concentration under absolute the phosphorous vapor pressure of 6 kg/cm² failed to provide an InP single crystal wafer of a high resistivity. The resistivities of the both were 4,000 cm²/V·s or more.

Figure 5:
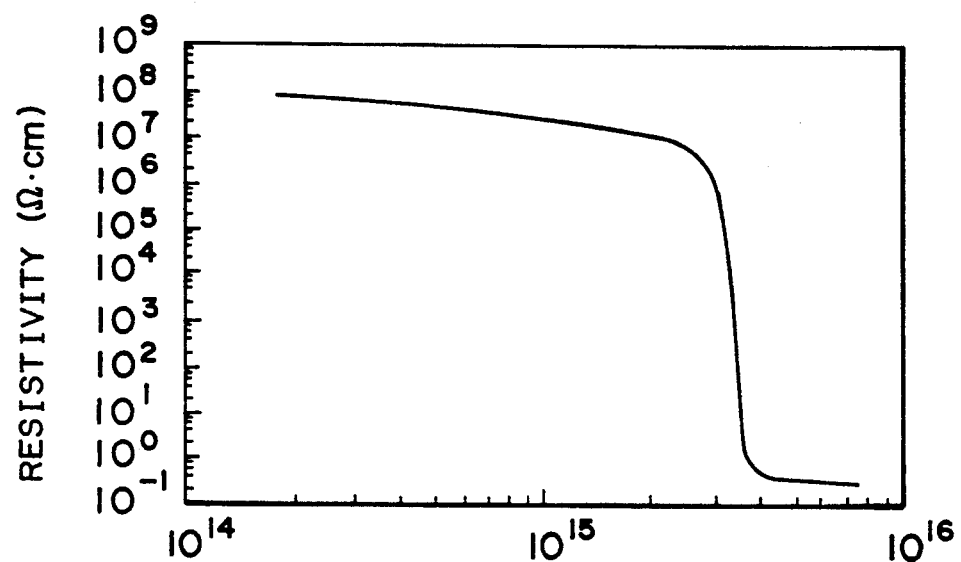
FIG. 5 is a graph of a relationship between the carrier concentration of a used raw InP polycrystal and the resistivity of an InP single crystal wafer after heat-treatment.
Figure 6:
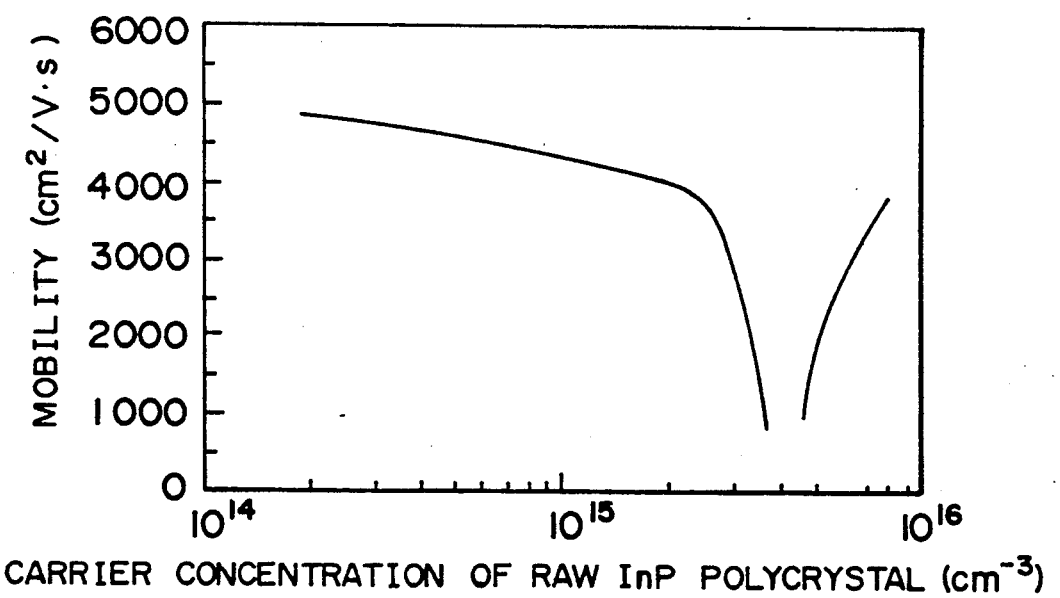
FIG. 6 is a graph of a relationship between the carrier concentration of a used raw InP polycrystal and the mobility of an InP single crystal wafer after heat-treatment.
Figure 7:
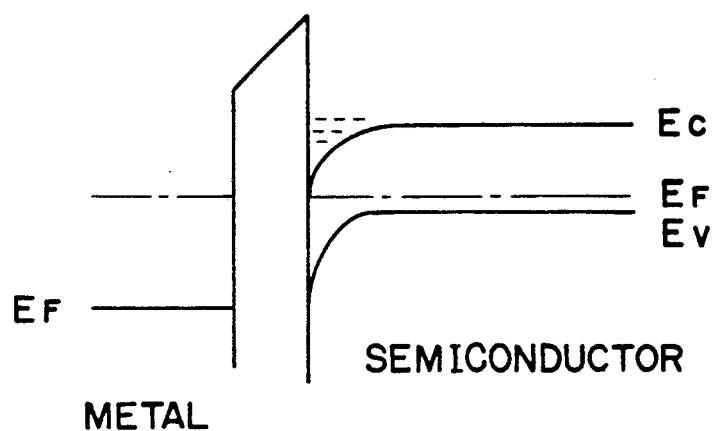
FIG. 7 is a schematic diagram of an energy band of a MIS device of the third aspect of the present invention.

FIG. 5 represents a relationship between carrier concentrations of a raw InP polycrystal and resistivities of a final InP single crystal wafer when undoped InP single crystal ingots were grown from InP polycrystals of different carrier concentrations by the liquid encapsulated Czochralski method and InP single crystal wafers sliced from the InP single crystal ingots and the InP single crystal wafers were heat treated under the absolute phosphorous vapor pressure of 7.5 kg/cm² in essentially the same manner as described above in Example 3. FIG. 6 represents a relationship between carrier concentrations of the raw InP polycrystal and the mobilities of the final InP single crystal wafer in the same case of FIG. 5.

As seen in FIGS. 5 and 6, a carrier concentration of $3 \times 10^{15}$ cm$^{-3}$ or less of the raw InP polycrystal provides a resistivity of $10^6$ Ω·cm or more for the final InP single crystal wafer and a mobility of 3000 cm²/V·s or more. As seen in FIG. 6, the mobility of the final InP single crystal wafer increases beyond a carrier concentration of $5 \times 10^{15}$ cm$^{-3}$ because the final InP single crystal wafer was not semi-insulating.

Examples 1-3 have described the InP single crystal wafer when the heat treatment temperature was 900° C. However, a semi-insulating InP single crystal, semiconductor device with a substrate of crystal and processes of producing them are disclosed. Heat-treating an undoped InP single crystal having a concentration of 0.05 ppmw or less for all native Fe, Co and Cr under a phosphorous vapor pressure at other temperatures provided a semi-insulating InP single crystal of a resistivity of $1 \times 10^6$ Ω·cm or more and a mobility of above 3,000 cm²/V·s both at 300K.

EXAMPLE 4

Example 4 describes a MISFET with a substrate made of an InP single crystal wafer of the first aspect of the present invention and a process for producing the MISFET.

An undoped n-type InP single crystal ingot with a 2-inch diameter and a concentration of 0.05 ppmw or less for all of Fe, Co and Cr was grown along the <100> orientation from a raw InP polycrystal having a carrier concentration of $1 \times 10^{15}$ cm$^{-3}$ by the Liquid encapsulated Czochralski method.

The InP single crystal ingot was sliced in a transverse direction to the pull axis thereof. The sliced InP wafer was washed with an organic solvent, then etched with bromomethanol and then washed with HF (i.e., hydrofluoric acid) immediately before an oxidation of the InP wafer. The InP wafer and red phosphorous were placed in a quartz ampoule. A gas in the quartz ampoule was evacuated so that the pressure therein was $1 \times 10^{-6}$ torr. Then, an oxyhydrogen burner melted the open end of the quartz ampoule to seal the quartz ampoule. The amount of the red phosphorous was adjusted so that the phosphorous vapor absolute pressure in the quartz ampoule was 15 kg/cm$^2$ at 900° C., i.e., a heat-treatment temperature. Then, the quartz ampoule was placed in the horizontal heating furnace, heated and held at a 900° C. for 20 hr and then naturally cooled.

Annealed wafers were lapped and mirror polished. Then, the undoped semi-insulating InP single crystal wafer was pretreated with a phosphoric acid etchant. Then, the pretreated InP single crystal wafer and a predetermined amount of phosphorus were placed in a quartz ampoule. A gas in the quartz ampoule was evacuated to vacuum. Then, oxygen gas of a pressure of 1.0 atm was introduced into the quartz ampoule. Then, the quartz ampoule was sealed. The predetermined amount of phosphorus was such that the phosphorous vapor pressure was a pressure of 0.9 atm in a heating of the quartz ampoule. Then, the quartz ampoule was heated at 500° C. for 5 hr, which produced a thermal oxidation film on the surface of the InP single crystal. Then, the quartz ampoule was cooled and then opened. Measuring the thickness of the thermal oxidation film provided about 40 nm.

Then, a selective ion implantation through the above thermal oxidation film implanted Si ions onto the top surface of the InP single crystal wafer. Then, activation-annealing the InP single crystal wafer produced a pair of n$^+$-contact layers 2a and 2b providing a source domain and a drain domain in an upper area of the InP single crystal wafer. A spacing between the n$^+$-contact layers 2a and 2b was 1 μm.

Figure 8:
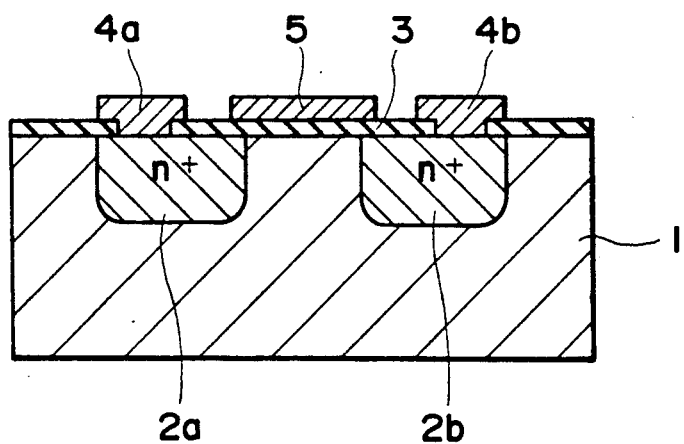
FIG. 8 is schematic cross-section of a MISFET of one embodiment of the third aspect of the present invention.

Then, opening part of the thermal oxidation film 3 produced on the top surface of the InP single crystal wafer 1 caused the n$^+$-contact layers 2a and 2b to appear. Then, an Au/Ge layer was vapor deposited atop the thermal oxidation film 3 and the n$^+$-contact layers 2a and 2b. Then, the Au/Ge layer vapor deposited InP single crystal wafer was annealed. Then, patterning the Au/Ge layer formed ohmic electrodes 4a and 4b provided a source electrode and a drain electrode. Then, vapor depositing a 200 nm thick layer of aluminum on the thermal oxidation layer, source electrode 4a and drain electrode 4b and then patterning the layer of aluminum produced a gate electrode 5 to provide a MISFET of FIG. 8.

Checking properties of the resulting MISFET confirmed that the cutoff frequency $f_T$ thereof was 30 MHz and it was a very high-speed device.

Example 4 employed the thermal oxidation film as the gate insulation film. Alternatively, an SiN$_x$ film or SiO$_2$ film produced by sputtering, plasma-enhanced CVD or the like may be employed.

In addition, since producing the gate insulation film by thermal oxidation gettered an impurity present on the top surface of the InP single crystal wafer in the gate insulation film, a repetition of a few times of the cycle of thermal oxidation and etching the resulting thermal oxidation film can clean the top surface of the InP single crystal wafer very well. Therefore, the gate insulation film may be produced after a few repetitions of the cycle.

Example 4 produced the n$^+$-contact layers after a production of the gate insulation film. However, alternatively the n$^+$-contact layers and the gate insulation film may be sequentially produced.

What is claimed is:

1. An undoped semi-insulating InP single crystal having a concentration of all native Fe, Co and Cr of 0.05 ppmw or less, said crystal having a resistivity of $10^6$ Ω·cm or more and a mobility of above 3,000 cm$^2$/V·s both at 300° K.

2. A semiconductor device, comprising:
    a substrate made of an undoped semi-insulative InP single crystal having a resistivity of $10^6$ Ω·cm or more and a mobility of above 3,000 cm$^2$/V·s both at 300° K., the crystal having a concentration of 0.05 ppmw or less of all native Fe, Co and Cr;
    an insulating layer formed on the top surface of said substrate;
    a gate electrode formed on said insulating layer; and
    a source region and a drain region both formed in the top surface of said substrate, said source and drain regions being formed on opposite sides of said gate electrode.

3. The semiconductor device of claim 2, wherein said insulating layer is formed by selective silicon ion implantation.

4. The semiconductor device of claim 2, wherein said insulating layer comprises a SiN$_x$ film.

5. The semiconductor device of claim 2, wherein said insulating layer comprises a SiO$_2$ film.

6. The semiconductor device of claim 2, wherein said gate electrode is an aluminum layer.

7. The semiconductor device of claim 2, wherein said source and drain regions comprise a silver/germanium layer.

8. A semiconductor device comprising:
    a substrate made of an undoped semi-insulative InP single crystal having a resistivity of $10^6$ Ω·cm or more and a mobility of above 3,000 cm$^2$/V·s both at 300° K., the crystal having a concentration of 0.05 ppmw or less of all native Fe, Co and Cr;
    an insulating layer of Si, SiN$_x$ or SiO$_2$ formed on the top surface of said substrate;
    a gate electrode formed of aluminum on said insulating layer;
    a source region and a drain region both formed in the top surface of said substrate, said source and drain regions being formed on opposite sides of said gate electrode, and said source and drain regions comprising a silver/germanium layer.

* * * * *